(12) United States Patent
Bancel et al.

(10) Patent No.: US 7,478,293 B2
(45) Date of Patent: Jan. 13, 2009

(54) METHOD OF SECURING THE TEST MODE OF AN INTEGRATED CIRCUIT VIA INTRUSION DETECTION

(75) Inventors: Frédéric Bancel, Lamanon (FR); David Hely, Marseille (FR)

(73) Assignee: STMicroelectronics S.A., Montrouge (FR)

( * ) Notice: Subject to any disclaimer, the term of this patent is extended or adjusted under 35 U.S.C. 154(b) by 183 days.

(21) Appl. No.: 11/046,216

(22) Filed: Jan. 28, 2005

(65) Prior Publication Data

US 2005/0172184 A1 Aug. 4, 2005

(30) Foreign Application Priority Data

Jan. 29, 2004 (FR) .................................. 04 00837

(51) Int. Cl.
*G01R 31/28* (2006.01)

(52) U.S. Cl. .................................................... 714/724

(58) Field of Classification Search ......... 714/724–726; 713/189, 194
See application file for complete search history.

(56) References Cited

U.S. PATENT DOCUMENTS

| 5,357,572 A | 10/1994 | Bianxo et al. |
| 5,737,756 A * | 4/1998 | White et al. ................ 711/142 |
| 6,496,119 B1 | 12/2002 | Otterstedt et al. |
| 7,076,667 B1 * | 7/2006 | Gama et al. ................. 713/193 |
| 7,106,091 B2 * | 9/2006 | Gammel ........................ 326/8 |
| 2003/0204801 A1 | 10/2003 | Tkacik et al. |
| 2003/0218475 A1 | 11/2003 | Gammel |

FOREIGN PATENT DOCUMENTS

| EP | 1 089 083 A1 | 4/2001 |
| JP | 401297733 A | * 11/1989 |

OTHER PUBLICATIONS

French Search Report from corresponding French Application No. 04/00837, filed Jan. 29, 2004.
French Search Report from related French Patent Application 04-00836, filed Jan. 29, 2004.
Patent Abstracts of Japan, vol. 2003, No. 04, Apr. 2, 2003 & JP 2002 365337 A (Sony Corp.), Dec. 18, 2002.
Patent Abstracts of Japan vol. 2003, No. 01 Jan. 14, 2003, & JP 2002 269523 A, Sep. 20, 2002.
Jaramillo, K. et al., 10 Tips for Successful Scan Design: Part One, EDN Electrical Design News, Cahners Publishing Co., Newton, MA, vol. 45, No. 4, Feb. 17, 2000, pp. 67-73 and 75, XP000966353 ISSN: 0012-7515.

* cited by examiner

*Primary Examiner*—Cynthia Britt
(74) *Attorney, Agent, or Firm*—Lisa K. Jorgenson; James H. Morris; Wolf, Greenfield & Sacks, P.C.

(57) ABSTRACT

An electronic circuit, including: a logic circuit having a plurality of logic cells; storage cells able to form a shift register, able to be connected to the logic cells; a connection control module having an input for the reception of an identification key, the module connecting the storage cells so as to form a test shift register when the receive input receives a valid identification key, and the module connecting the storage cells so as to form randomly a diversion circuit when the input does not receive a valid identification key. The invention allows the electronic circuit to be protected against fraudulent access in read or write mode. The invention also relates to a smart card including this electronic circuit.

16 Claims, 1 Drawing Sheet

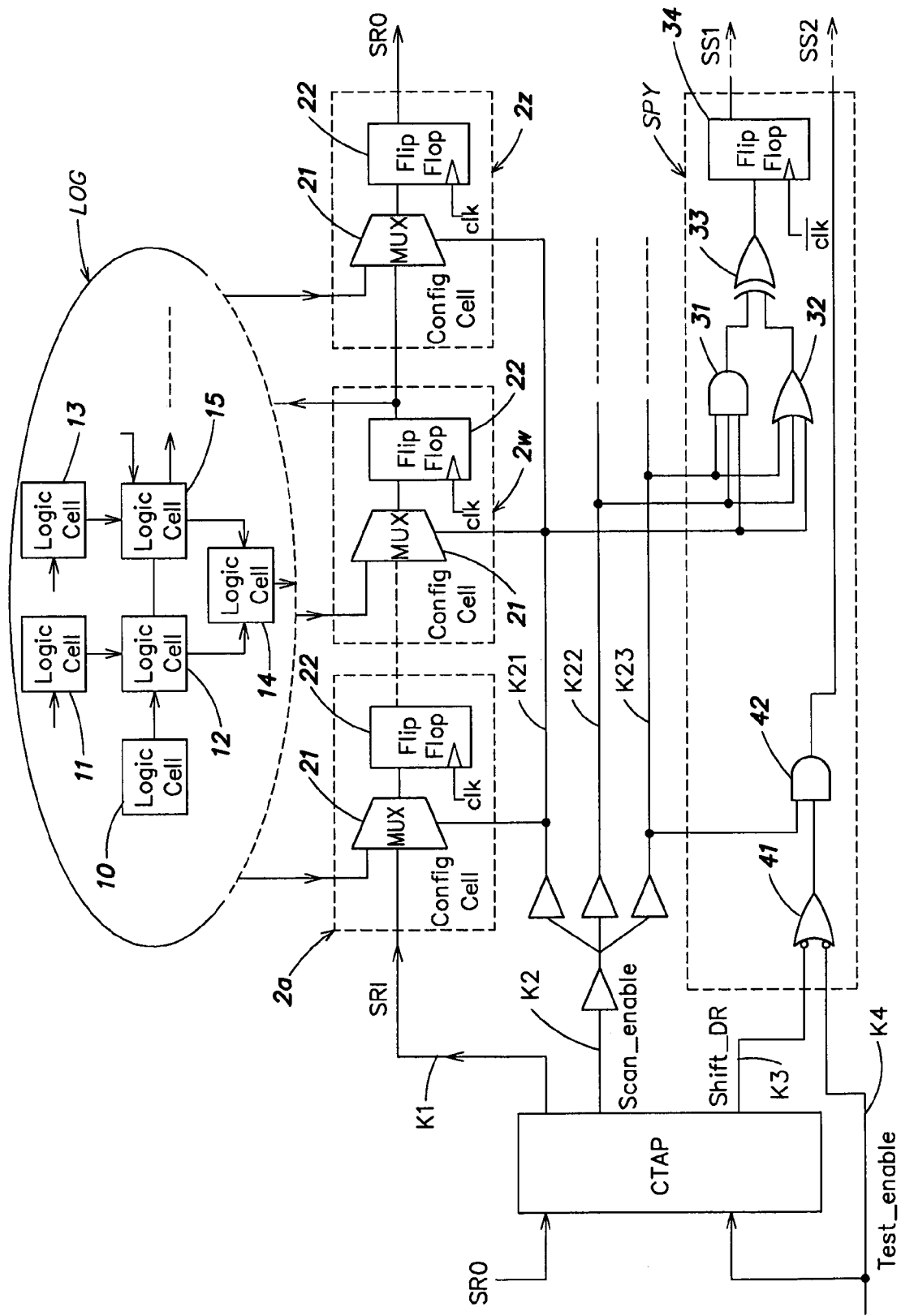

METHOD OF SECURING THE TEST MODE OF AN INTEGRATED CIRCUIT VIA INTRUSION DETECTION

BACKGROUND OF THE INVENTION

1. Field of the Invention

Overall, the invention relates to synchronized electronic integrated circuits equipped with means for combinational logic, with flip-flops, and with means for testing.

More precisely, the invention relates to an electronic circuit comprising: a number of logic cells; a number of configurable cells each comprising at least a multiplexer and a flip-flop; and a number of control conductors connected, for some of them at least, to the configurable cells and on which control signals, selectively circulate, received and/or emitted during the operating of a control circuit such as an access control, the configurable cells selectively adopting, depending on the control signals, a standard operating mode in which they are operationally connected to at least some of the logic cells with which they co-operate to create a logic circuit, and a test mode in which these configurable cells are operationally connected in chains to create a shift register equipped with a data input and output.

2. Discussion of the Related Art

Nowadays it is common knowledge that the proper working order of the operating elements of an integrated circuit should be checked by imposing and/or by determining, at pre-set times, the data at certain internal points of this integrated circuit.

Such a test technique of the internal paths of an integrated circuit (designated "scanpath" or "internal scan method") is for example disclosed in the document by M. Williams and J. Angel, entitled "Enhancing Testability of LSI Circuits Via Test Points and Additional Logic, IEEE Transactions on Computers", vol. C-22, No.1. January 1973, which is incorporated herein by reference.

According to this technique, each of the flip-flops in the logic circuit, for which it is useful to know the state and/or to impose the content during the standard operating of the integrated circuit, is equipped with a multiplexer at its input.

The different flip-flops and the multiplexers which are connected to them thus constitute the equivalent number of configurable cells whose access is controlled by these multiplexers.

The multiplexers of these different configurable cells are jointly controlled by an access controller or "TAP controller" (Test Access Port) which, according to a chosen operating mode, uses this set of configurable cells either as a standard operating circuit integrated into the logic circuit which it creates with the logic cells, or as a test circuit.

To accomplish this, the TAP controller receives control signals on different control conductors, and/or consigns control signals on different control conductors by which it is connected to the different configurable cells, such as a mode control signals, a chain control signal or a data propagation control signal, which permit the modifying and/or modify the data circulation paths within the integrated circuit and thus allow entry of this data, for future analysis, via the controller.

In the standard operating mode, the TAP controller therefore pilots the multiplexers of the configurable cells in such a way that the flip-flops of these cells are connected to the surrounding logic cells in order to define one or several operating sub-sets of the integrated circuit.

In the test mode, which is generally triggered off when the TAP controller receives an impulse control signal in test mode, this controller generates a chaining control signal in order to connect, in series, the flip-flops of the configurable cells so as to create a shift register.

This register includes a series input and a serial output respectively connected to an output and an input of the TAP controller, as well as a clock input receiving a clock signal in order to give rhythm to the flow of data.

Initially, the TAP controller loads, in series, the data in the flip-flops of the configurable cells via the shift register input that creates these cells.

Then, the TAP controller changes the switching of the multiplexers in order to create the operational circuit, and controls the running of one or several clock cycles via this operational circuit. In this stage, the data loaded into the flip-flops of the configurable cells is handled by the operational circuit.

The controller then, once again, changes the switching of the multiplexers in order to, once again, create the shift register and restores, in series on the output of this shift register, the data stored in the flip-flops of the configurable cells during the last clock cycle.

Despite the proven interest of this testing technique, its practical application can under certain circumstances prove to be problematic, notably on integrated circuits which handle secret data.

Indeed, as the actuating of the test mode can allow a fraudulent operator to read the content of the flip-flops of the configurable cells, this test technique has, in principle, the inconvenience of rendering such circuits very vulnerable to fraudulent activity.

For example, by stopping, at different moments, an internal secret data loading process in the integrated circuit and by off-loading the contents of the shift register, a fraudulent operator can obtain information from the secret data, even reconstitute it.

By actuating the test mode, a fraudulent operator can also gain write access to the flip-flops of the configurable cells so as to insert fraudulent data, or to put the integrated circuit into an unauthorized configuration. The person can thus, for example, gain access to a register that controls a security element such as a sensor in order to deactivate it. The person can also input erroneous data with the aim of obtaining information on secret data.

The fraud can have two different strategies; the first consists in taking control of the TAP controller and observing on the external contacts the contents of the shift register cells, and the second consists in taking control of the configurable cells by exciting them via microprobing in order to simulate the piloting of these cells by the control signals that the TAP controller emits.

Attempt fraud as per the first strategy can be stopped via a technique which is covered by an application being filed at this same time by the holder.

One purpose of the invention is to propose an electronic circuit designed to foul attempts at fraud in compliance with aforementioned second strategy.

SUMMARY OF THE INVENTION

The electronic circuit in accordance with the invention, comprises a spy circuit connected to control conductors, running a logic combination of the signals passing through these control conductors, and delivering an output signal selectively adopting a state representative of no faults or a state representative of attemped intrusion, depending on whether the combination of signals passing throught the control conductors corresponds, or not, to a combination of control signals visible in an operating state authorized by the electronic circuit.

For example, it is possible to envisage that the spy circuit runs a combinatin of signals circulating through a first set of control conductors of which each is assigned to the transmitting of the chain control signal configuring the configurable cells in shift register, and that the spy circuit delivers at least an output signal of a first type adopting a state representative of no faults if, and only if, the signals circulating through the first set of control conductors are simultaneously in the same state.

It is however also possible, in replacement of or in addition to the previous measure, to envisage that the spy circuit runs a combination of signals circulating through a second set of control conductors of which at least a first one is assigned to the transmitting of the chain control signal, of which at least a second one is assigned to the transmitting of the passing control signal in test mode which actuates the control circuit, and of which at least a third one is assigned to the transmitting of the data propagation control signal in the configurable cells, and that the spy circuit delivers at least an output signal of a second type adopting a state representative of attempted intrusion if one or other of the passing control signals in test mode and propagation control signals is inactive, whereas the chain control signal is active.

Irrespective of the chosen embodiment, it is advantageous to envisage that the output signal of the spy circuit is guided to the configurable cells and resets the flip-flops of these configurable cells to zero when it adopts its state representative of attempted intrusion.

BRIEF DESCRIPTION OF THE DRAWINGS

Other features and advantages of the invention will become clearer from the following description, given, by way of a non-restrictive example, in reference to FIG. 1 which illustrates an electronic circuit in accordance with two embodiments of the invention that can be used either separately or jointly, and simultaneously represented.

DETAILED DESCRIPTION

As discussed above, the invention relates to an electronic circuit equipped with means for internal testing.

Such a circuit normally comprises a number of logic cells such as cell 10 to 15, a number of configurable cells such as cells 2a, 2w and 2z, a number of control conductors such as conductors K1 to K4 and K21 to K23, possibly as well as a control circuit such as an access controller CTAP, which can however also be out with the electronic circuit in question.

Each of the configurable cells such as 2a, 2w and 2z comprises at least a multiplexer 21 and at least a flip-flop 22.

The control conductors K1 to K4 and K21 to K23, of which at least some are connected to the configurable cells 2a, 2w and 2z, perform the transmitting of control signals selectively received and/or emitted during the operating of the control circuit CTAP, such as a passing control signal Test_enable in test mode which actuates the control circuit CTAP, a chain control signal SCAN_enable which chains the configurable cells in the form of a shift register, and a control signal Shift_DR which propagates the data in the configurable cells.

Depending on these control signals or at least some of them, the configurable cells 2a, 22 and 2z either adopt a standard operating mode, in which they are operationally connected to at least some of the logic cells 10 to 15 with which they co-operate to create a logic circuit LOG, or a test mode in which these configurable cells 2a, 2w and 2z are operationally chain connected to each other to create a shift register.

The switching of the configurable cells from the standard operating mode to the test mode is performed via the piloting of the multiplexers 21 by means of at least some of the control signals delivered by the control circuit CTAP.

The shift register 2a to 2z notably has a data input SRI piloted by a control circuit CTAP output, a data output SRO, connected to a control circuit CTAP input, and a clock input (not specifically represented) in order to receive a clock signal Clk designed to give rhythm to the flow of data in this shift register.

So as to launch to test, a passing control signal Test_enable in test mode must first of all be consigned to the control circuit CTAP on the control conductor K4.

The control circuit CTAP then configures the configurable cells 2a to 2z in shift register via the emitting of the chain control signal Scan_enable.

Then, by emitting the propagation control signal Shift_DR, the control circuit CTAP loads, in series, the test data in the flip-flops 22 of these configurable cells through the SRI input of the shift register.

Then, by deactivating the chain control signal Scan_enable, the control circuit CTAP reconfigures the configurable cells 2a to 2z into an operational element of the logic circuit LOG and controls the running of one or several clock cycles via this operational element, which handles the test data.

By reactivating the chain control signal Scan_enable, the control circuit CTAP once again reconfigures the configurable cells 2a to 2z in shift register.

Finally, by emitting the propagation control signal Shift_DR, the control circuit CTAP recuperates, at the SRO output of this register, the data stored in the flip-flops 22 and derived from the handling of the test data by the logic circuit LOG.

To prevent particularly a fraudulent operator from simulating such a test process by directly applying control signals to the conductors K1 to K4 and K21 to K23, and/or data to the SRI input, and from thus fraudulently obtaining the data stored in the flip-flops 22 and derived from the handling of the test data by the logic circuit LOG, the electronic circuit of the invention comprises a spy circuit SPY connected to control conductors such as K1 to K4 and K21 to K23.

This spy circuit SPY, which runs a logic combination of the signals passing through the different control conductor, has the role of delivering an output signal such as SS1 or SS2 whose state is representative of no faults or on the contrary of attempted intrusion.

More precisely, the output signal SS1 or SS2 of the spy circuit SPY adopts a state representative of no faults or attempted intrusion depending on whether the combination of signals passing through the spy control conductors corresponds, or not, to a combination of control signals visible in an operating state authorized by the electronic circuit.

For example, in one of the illustrated embodiments of the invention, the spy circuit SPY runs a combination of signals passing through a first set of control conductors K21 to K23 each of which is assigned to the transmitting of the chain control signal Scan_enable which configures the configurable cells in shift register.

The spy circuit SPY comprises logic gates ET 31 or 32 or EXCLUSIVE 33 and a flip-flop 34 interconnected as illustrated and thus delivers an output signal SS1 which adopts a state representative of no faults if, and only if, the signals circulating on the control conductors K21 to K23 are simultaneously in the same state.

The spy circuit SPY is thus capable of detecting if one or other of the control conductors K21 to K23, on which the same signal normally circulates, has been attacked with the aim of changing its value.

In the second illustrated embodiment, and possibly concurrently with the first embodiment, the spy circuit SPY runs a combination of signals circulating on a second set of control conductors K23, K3 and K4 whose first one, K23, is assigned to transmitting the chain control signal Scan_enable configuring the configurable cells in shift register, whose second one, K4, is assigned to transmitting the passing control signal Test_enable in test mode which actuates the control circuit, and whose third one, K3, is assigned to transmitting the data propagation control signal Shift_DR in the configurable cells.

This spy circuit SPY comprises logic gates NON-OU 41 and ET 42 interconnecte as illustrated and thus delivers an output signal SS2 which adopts a state representative of attempted intrusion if one or other of the passing control signals Test_enable in test mode and propagation control signals Shift_enable is inactive, whereas the chain control signal Scan_enable is active.

The spy circuit SPY utilizes the coherence normally existing between the states taken through time by the differnet internal control signals of the electronic circuit to give warning, in the event of detecting a breakage in this coherence, that one of the control conductors, on which a control signal compelled to this coherence normally passes, has been attacked with the aim of giving it a different value to that envisaged by this same coherence.

In any event, the output signal SS1 and/or SS2 of the spy circuit SPY is advantageously guided to the configurable cells 2a, 2w and 2z and resets the flip-flops 22 of these configurable cells to zero when it adopts its state representative of attempted intrusion.

Having thus described at least one illustrative embodiment of the invention, various alterations, modifications, and improvements will readily occur to those skilled in the art. Such alternations, modifications, and improvements are intended to be within the spirit and scope of the invention. Accordingly, the foregoing description is by way of example only and is not intended as limiting. The invention is limited only as defined in the following claims and equivalents thereto.

What is claimed is:

1. Electronic circuit comprising:
   a number of logic cells;
   a number of configurable cells each comprising at least a multiplexer and a flip-flop;
   a number of control conductors connected, for some of them at least, to the configurable cells and on which control signals selectively circulate, received and/or emitted during the operating of a control circuit such as an access control, the configurable cells selectively adopting, depending on the control signals, a standard operating mode in which they are operationally connected to at least some of the logic cells with which they co-operate to create a logic circuit, and a test mode in which these configurable cells are operationally connected in chains to create a shift register equipped with a data input and a data output; and
   a spy circuit connected to control conductors, running a logic combination of the signals passing through these control conductors, and delivering an output signal selectively adopting a state representative of no faults or a state representative of attempted intrusion, depending on whether the combination of signals passing through the control conductors corresponds, or not, to a combination of control signals visible in an operating state authorized by the electronic circuit, wherein, if the spy circuit runs a combination of signals circulating through a first set of control conductors each of which is assigned to the transmitting of the chain control signal configuring the configurable cells in shift register, the spy circuit delivers at least an output signal of a first type adopting a state representative of no faults when the signals circulating through the first set of control conductors are simultaneously in the same state.

2. Electronic circuit according to claim 1, wherein the spy circuit runs a combination of signals circulating through a second set of control conductors of which at least a first one is assigned to the transmitting of the chain control signal configuring the configurable cells in a shift register, of which at least a second one is assigned to the transmitting of the passing control signal in test mode which actuates the control circuit, and of which at least a third one is assigned to the transmitting of the data propagation control signal in the configurable cells, and in that the spy circuit delivers at least an output signal of a second type adopting a state representative of attempted intrusion when one or other of the passing control signals in test mode and propagation control signals is inactive, whereas the chain control signal is active.

3. Electronic circuit according to claim 1, wherein the output signal of the spy circuit is guided to the configurable cells and resets the flip-flops of these configurable cells to zero when it adopts its state representative of attempted intrusion.

4. An electronic circuit capable of adopting a test mode and an operating mode, the electronic circuit comprising:
   at least one logic cell;
   at least one control conductor;
   at least one configurable cell, the at least one configurable cell comprising at least one multiplexer and at least one flip-flop; and
   a spy circuit coupled to the at least one control conductor, wherein the spy circuit is configured to run a first combination of signals passing through the at least one control conductor and produce at least one output signal, the least one output signal being capable of resetting the at least one flip-flop to zero, wherein the spy circuit produces at least one output signal indicating no attempted intrusion when the signals passing through the at least one control conductor have identical states.

5. The electronic circuit of claim 4, wherein the first combination of signals differs from a second combination of signals passing through the at least one control conductor in the operating mode when the at least one output signal indicates the attempted intrusion.

6. The electronic circuit of claim 4, wherein, in the test mode, the at least one configurable cell forms a shift register.

7. The electronic circuit of claim 6, wherein the spy circuit runs the first combination of signals passing through the at least one control conductor, the at least one control conductor transmitting a chain control signal capable of configuring the at least one configurable cell to form the shift register.

8. The electronic circuit of claim 7, wherein the spy circuit runs the first combination of signals passing through the at least one control conductor, the at least one control conductor comprising at least one first conductor transmitting a chain control signal capable of configuring the at least one configurable cell to form the shift register, at least one second conductor transmitting, in the test mode, a passing control signal, and at least one third conductor transmitting a data propagation control signal in the at least one configurable cell.

9. The electronic circuit of claim 8, wherein the spy circuit produces at least one output signal indicating an attempted intrusion when either the passing control signal or the data propagation control signal is inactive and the chain control signal is active.

10. The electronic circuit of claim 4 further comprising a control circuit.

11. A method for detecting intrusion into an electronic circuit, the method comprising:

using a control circuit to provide at least one control signal to form a shift register from at least one configurable cell to actuate a test mode, the at least one configurable cell comprising at least one multiplexer and at least one flip-flop;

using an spy circuit coupled to at least one control conductor to run a first combination of signals passing through the at least one control conductor;

using the electronic circuit to run a second combination of signals passing through the at least one control conductor in an operating mode; and using the spy circuit to produce at least one output signal indicating an attempted intrusion when the first combination of signals is different from the second combination of signals.

12. A method of claim 11, wherein the at least one output signal resets the at least one flip-flop of the at least one configurable cell to zero.

13. A method of claim 11, wherein the least one control conductor transmits a chain control signal capable of configuring the at least one configurable cell to form the shift register.

14. A method of claim 13, wherein the first combination of signals comprises signals that differ in at least one state.

15. A method of claim 13, wherein the least one control conductor comprises at least one first conductor transmitting a chain control signal capable of configuring the at least one configurable cell to form the shift register, at least one second conductor transmitting, in the test mode, a passing control signal, and at least one third conductor transmitting a data propagation control signal in the at least one configurable cell.

16. A method of claim 15, wherein the first combination of signals comprises the passing control signal and the data propagation control signal, with either the passing control signal or the data propagation control signal being inactive, and the chain control signal being active.

* * * * *

UNITED STATES PATENT AND TRADEMARK OFFICE
CERTIFICATE OF CORRECTION

| | |
|---|---|
| PATENT NO. | : 7,478,293 B2 |
| APPLICATION NO. | : 11/046216 |
| DATED | : January 13, 2009 |
| INVENTOR(S) | : Frederic Bancel et al. |

It is certified that error appears in the above-identified patent and that said Letters Patent is hereby corrected as shown below:

On the title page, the Abstract should read: item 57
The invention relates to an electronic circuit having configurable cells piloted by control signals to either adopt a standard operating mode in which they are integrated into a logic circuit, or a test mode in which they supply information to this logic circuit. The circuit of the invention includes a spy circuit designed to detect an abnormal excitation of some of the conductors along which the control signals pass, thus preventing fraudulent extraction of data from the configurable cells.

Col. 1, line 38, should read:
According to this technique, each of the flip-flops of the line 40, should read :
impose the contents during the standard operating of the inteline 56, should read:
control signal, a chain control signal or a data propagation lines 63-64, should read:
surrounding logic cells in order to define one or several operational sub-sets of the integrated circuit.

line 67, should read:
mode, this controller generates a chain control signal in

Col. 2, line 3, should read:
This register includes a serial input and a serial output line 22, should read:
Despite the proven interest of this test technique, its line 27, should read:
lent operator to read the contents of the flip-flops of the conline 52, should read:
Attempted fraud as per the first strategy can be stopped via a line 56, should read:
circuit designated to foul attempts at fraud in compliance with the

UNITED STATES PATENT AND TRADEMARK OFFICE
CERTIFICATE OF CORRECTION

PATENT NO. : 7,478,293 B2
APPLICATION NO. : 11/046216
DATED : January 13, 2009
INVENTOR(S) : Frederic Bancel et al.

It is certified that error appears in the above-identified patent and that said Letters Patent is hereby corrected as shown below:

line 66, should read:
representative of attempted intrusion, depending on whether line 67, should read:
the combination of signals passing through the control con- Col. 3, line 5, should read:
runs a combination of signals circulating through a first set of line 47, should read:
such as cells 10 to 15, a number of configurable cells such as line 60, should read:
control signal Scan_enable which chains the configurable line 64, should read:
them, the configurable cells 2a, 2w and 2z either adopt a Col. 4, line 46, should read:
signals passing through the different control conductors, has Col. 5, line 16, should read:
and ET 42 interconnected as illustrated and thus delivers an

UNITED STATES PATENT AND TRADEMARK OFFICE
CERTIFICATE OF CORRECTION

PATENT NO. : 7,478,293 B2
APPLICATION NO. : 11/046216
DATED : January 13, 2009
INVENTOR(S) : Frederic Bancel et al.

It is certified that error appears in the above-identified patent and that said Letters Patent is hereby corrected as shown below:

line 23, should read:
existing between the states taken through time by the different line 38, should read:
Such alterations, modifications, and improvements are Signed and Sealed this Third Day of March, 2009

JOHN DOLL
*Acting Director of the United States Patent and Trademark Office*